United States Patent [19]

Daughton

[11] Patent Number: 4,582,975

[45] Date of Patent: Apr. 15, 1986

[54] CIRCUIT CHIP

[75] Inventor: James M. Daughton, Saint Louis Park, Minn.

[73] Assignee: Honeywell Inc., Minneapolis, Minn.

[21] Appl. No.: 679,855

[22] Filed: Dec. 10, 1984

Related U.S. Application Data

[62] Division of Ser. No. 481,542, Apr. 4, 1983, Pat. No. 4,506,139.

[51] Int. Cl.⁴ .................... H01L 21/58; B23K 31/02
[52] U.S. Cl. ........................ 219/209; 219/85 CM; 219/85 R; 228/180.2
[58] Field of Search .............. 219/209, 210, 85 R, 219/85 M, 85 CA, 85 CM, 85 F, 501; 228/178, 179, 180.1, 180.2, 191, 238, 240; 29/839, 840; 357/28

[56] References Cited

U.S. PATENT DOCUMENTS

| | | | |
|---|---|---|---|
| 3,289,046 | 11/1966 | Carr | 219/209 |
| 3,499,218 | 3/1970 | Dahlgren | 29/621 |
| 3,582,610 | 6/1971 | Eckles | 219/209 |
| 3,660,632 | 5/1972 | Leinkram | 228/240 |

Primary Examiner—Clarence L. Albritton
Assistant Examiner—Teresa J. Walberg
Attorney, Agent, or Firm—Robert A. Pajak

[57] ABSTRACT

Disclosed is a method for removing a hybrid or integrated circuit chip soldered to a support structure. An electrical energy source is applied to the hybrid circuit chip for raising the temperature of the circuit chip sufficiently so as to melt the solderable material which interconnects the chip to the support structure. When the solderable material is melted, the circuit chip may then be removed from the support structure.

8 Claims, 6 Drawing Figures

CIRCUIT CHIP

This application is a division of application Ser. No. 481,542, filed Apr. 4, 1983, now U.S. Pat. No. 4,506,139.

BACKGROUND OF THE INVENTION

This invention is related to hybrid circuit chips or silicon substrate circuit flip chips which are soldered to a support structure. Specifically, there is provided a heating means integral with the circuit chip to permit unsoldering a specific chip which is soldered to a support structure or permit soldering a chip to a support structure without adversely affecting a neighboring chip and/or printed electrical conductors on the support structure.

Hybrid circuits usually include a plurality of circuit chips having one or more electrical components. These circuit chips are usually provided with a plurality of bonding pads for soldering to corresponding bonding pads on a glass or ceramic substrate which provide a support structure for the circuit chips. The hybrid circuit substrate or support structure also has a plurality of electrical conductors printed thereon using, typically, thin film or thick film techniques. The electrical conductors provide electrical interconnections between the circuit chips which have been soldered to the support structure.

Many circuit chips are silicon monolithic integrated circuits. This variety of circuit chips has bonding pads on one surface thereof and includes "solder bumps" on the pads. This type of chip is sometimes referred to as a flip chip. The solder bumps are part of the soldering process for soldering the circuit chip to the hybrid circuit support structure as is well known.

Since there is a very high cost in a completely assembled hybrid circuit, it is desirable to be able to repair an assembled hybrid circuit by removing a defective circuit chip and replacing it with an operative unit rather than scrapping the whole hybrid circuit. Prior art techniques for removing circuit chips from hybrid circuits include using a hand soldering iron, and using a rework fixture employing a hydrogen flame as a heating mechanism. These techniques, in many situations, result in irreparable damage to the electrical conductor patterns on the hybrid circuits as well as to adjacent good circuit chips and components. Another technique for removing hybrid circuits is shown in U.S. Pat. No. 3,904,100 in which a fixture is used in repairing hybrid circuits. The fixture includes a mechanism for heating a specific circuit chip to melt the soldering material between the circuit chip and the hybrid circuit substrate and permit removal of the circuit chip without damaging either adjacent circuit components or the conductor pattern on the hybrid circuit substrate. The latter technique for removing hybrid circuits has a disadvantage insofar as being a cumbersome apparatus to operate and requires an undue expense for providing the intended function.

SUMMARY OF THE INVENTION

The present invention is an improved circuit chip in which an electrical heating means is provided integral therewith. The electrical heating means may be simply utilized by applying an electrical energization source to a pair of terminating means accessibly located on the circuit chip and electrically connected to the heating means. When sufficient energy is provided, the temperature of the chip will rise to a point in which the soldered interconnection between the chip and the hybrid circuit substrate or support structure will be in excess of the melting point of the solder and permit removal of the improved circuit chip which had been soldered to the support structure, or conversely permit a new circuit chip, with the improvement of the present invention, to be soldered to the support structure without damage to the rest of the hybrid circuit.

DETAILED DESCRIPTION OF THE INVENTION

Figure 1:
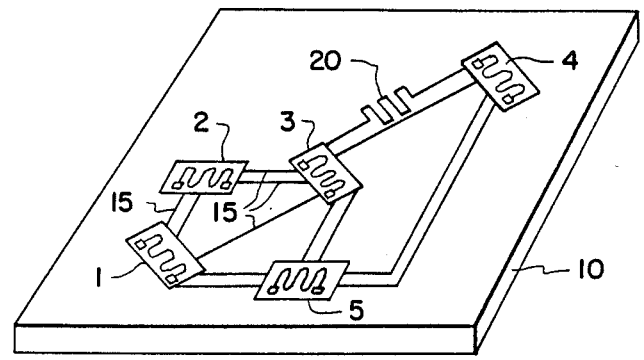
FIG. 1 is a diagrammatic sketch of a hybrid circuit.
Figure 2:
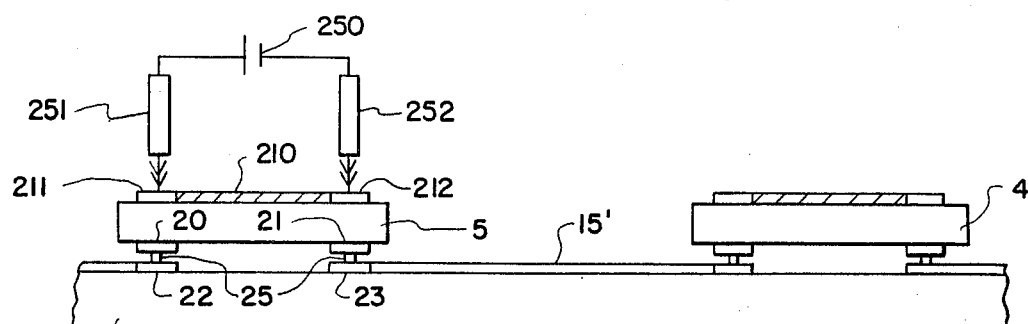
FIG. 2 is a side view showing the interconnection of a circuit chip to the support structure of the hybrid circuit.

Shown in FIGS. 1 and 2 is a sketch of a typical example of what is known as a hybrid circuit. The first element of a hybrid circuit is a substrate or support structure 10 usually of a silicon or alumina material. Printed on the support structure, usually using thick or thin film technologies and the like, is an electrical conductor pattern and a plurality of bonding pads for subsequent soldering to a plurality of circuit chips. In FIG. 1 the conductor pattern is indicated by numeral 15. The bonding pads on the support structure are printed so as to have a pattern which corresponds to a matching set of bonding pads on the circuit chips, 1 through 5. Of course, each of the chips has a structure where electrical circuit components (not shown) are provided and wherein the circuit chip includes bonding pads electrically connected to selected ones of the circuit components. The conductors 15, therefore, are provided for interconnecting the electrical circuit components contained on each of the circuit chips. Also printed on a substrate may be one or more resistor patterns 20 for providing resistance between selected bonding pads and therefore between selected circuit components of selected circuit chips. The hybrid circuit just described is, of course, well known in the art.

Shown in FIG. 2 is a sketch of how the circuit chips may be bonded to the support structure. For example, chip 5 has bonding pads 20 and 21 which correspond to bonding pads 22 and 23 printed on support structure 10. The corresponding bonding pads are then bonded together with a metallic material 25 such as solder using an ordinary soldering process well known in the hybrid circuit technology. Bonding pads 20 and 21 are usually small metalized areas having a very high conductivity. The bonding pads on circuit chip 5 may be provided by a variety of techniques including thin-thick printing techniques, ion-deposition and the like.

Also shown in FIG. 2 is an adjacent circuit chip 4 bonded in a similar manner. In order to remove circuit chip 5 from substrate 10, it is necessary to melt the solder material 25 between corresponding bonding pads of chip 5 and substrate 10 without disturbing or damaging chip 4 or the interconnecting conductor 15'.

In one embodiment of the present invention, as illustrated in FIG. 2, circuit chip 5 includes an electrical heating means consisting of a resistive film 210 integral with chip 5. At a first end of resistor film 210 is a terminating region 211 and at the other end is a terminating region 212. Terminating regions 211 and 212 may be, by way of example, metallic electrically conductive pads which are adapted to be electrically connected to an electrical energization source 250 through electrical probes 251 and 252.

Figure 3:
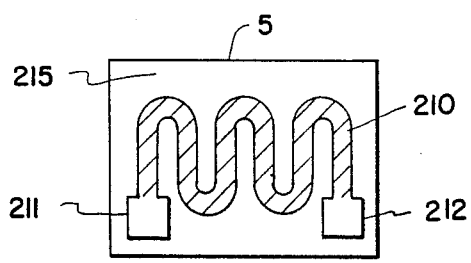
FIG. 3 is one embodiment of the present invention.
Figure 4:
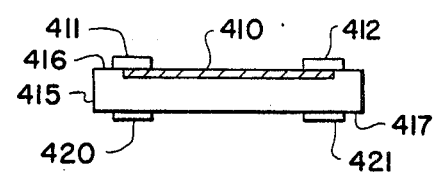
FIG. 4 is another embodiment of the present invention.

Shown in FIG. 3 is a top view of chip 5 opposite the side having the bonding pads. The resistive film 210 may be integral with chip 5 by applying a resistive film, using thin or thick film techniques, on surface 215 of chip 5, surface 215 being the opposite side of chip 5 having bonding pads 20 and 21. As illustrated in FIG. 3, resistive film 210 may have a serpentine form. However, the form or pattern of the resistive film is not critical to its intended function.

The operation of the invention as illustrated in FIGS. 2 and 3 will now be described. Assume a situation where chip 5 has been soldered to the support structure 10 using a metallic material comprising a tin-lead alloy. Electrical probes 251 and 252 are positioned to make contact with the accessibly located terminating regions 211 and 212, and therefore electrical connection to resistive film 210. If electrical energization source 250 is of sufficient magnitude, current will flow through resistive film 210 and cause the temperature of chip 5 to rise due to conducted heat from the power dissipated in resistive film 210. In turn, bonding pads 20 and 21, and the adjacent solder material 25 will be heated by the conducted heat through chip 5. When the temperature of bonding pads 20 and 21 rises in excess of the melting point of the metallic material, namely the solder, the solder material will melt and chip 5 may then be removed. Since only chip 5 and bonding pads 20 and 21 along with the soldering material have been heated, no damage can result to conductor 15' or to adjacent chip 4.

Thus, the improved circuit chip containing the integral heating means permits a simple method for removing a chip soldered to a support structure without the use of a specialized extraction apparatus and without consequential damage to surrounding conductors and/or adjacent circuit chips. Practice of the invention permits repairing hybrid circuits in the field because of its simplicity. Of course, it should be understood that a replacement circuit chip for circuit chip 5 may be then soldered to a support structure using the reverse method. That is, by simply positioning a replacement circuit chip over the corresponding bonding pads of the support structure with some solder material, and applying an electrical energization source across the electrical heating means sufficient to melt the soldering material, the replacement chip may then be bonded to the support structure.

It should be noted that the terminating regions (211 and 212) of the electrical heating means (210) are normally electrically isolated from the chip bonding pads and electrical circuit components connected thereto. Otherwise, damage to the electrical circuit components could result. However, there is no requirement for electrical isolation in practice of the present invention.

Figure 5:
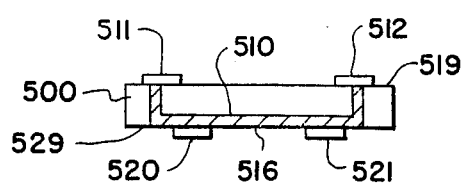
FIG. 5 is a side view of a circuit chip using diffusion techniques for implementing an electrical heating means.

As thus far presented, the resistive heating means has been described showing a resistive printed film on a chip utilizing thin or thick film technologies. On the other hand, the resistive means may also be diffused into a silicon monolithic integrated circuit chip having electrical circuit components integrated therein with electrical connections to selected bonding pads. In FIG. 5, there shown is a simple sketch of a resistive heating means 410 diffused into chip 415 by well known diffusion techniques. Terminating regions 411 and 412 are shown at each end of resistive means 410 accessibly located on one side 416 of chip 415. On the opposite side 417 there shown are bonding pads 420 and 421, the latter bonding pads being used for soldering chip 415 to support structure 10. Like chip 5, chip 415 may be heated by applying an electrical energization source across accessibly located terminating regions 411 and 412. Chip 415 may be a flip chip including solder bumps on bonding pads 20 and 21.

Figure 6:
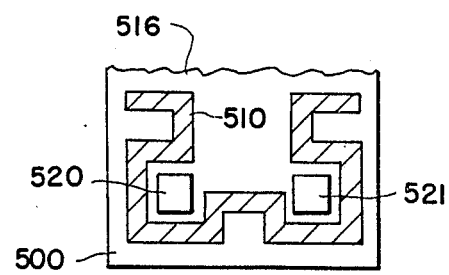
FIG. 6 is a bottom view of the chip shown in FIG. 5.

FIGS. 5a and 5b show another example of a diffused resistive means. There shown is a silicon monolithic integrated circuit chip 500 wherein electrical circuit components (not shown) are provided and accessible through bonding pads 520 and 521 on side 516. A doping material 510 is diffused into chip 500 for providing a resistive material. The resultant resistive material is provided with accessible terminating regions 511 and 512 at the ends thereof. These accessible terminating regions are on side 519 opposite side 516. Shown in FIG. 6 is a bottom view of chip 500 shown in FIG. 5. The sketch shown in FIG. 6 shows how the diffused resistance material has been patterned to surround bonding pads 520 and 521. FIG. 6 shows an example of how an electrical heating material diffused into a chip can be positioned to surround the chip bonding pads to enhance heat conduction therebetween. This technique may not be necessary because of the usually small thickness of circuit chips.

The embodiments of the integral electrical heating means provided by the resistance material shown in the accompanying drawing are just some examples of how a resistive electrical heating means may be implemented and made integral with a circuit chip. Of course, the electrical circuit components integral with the circuit chips must, of course, be impervious to temperatures near the melting point of the metallic material used for bonding the chip bonding pads to the support structure bonding pads. Although this is of no concern when removing a defective chip, it is important when practicing the invention of both the improved chip and the method of replacing the old chip with a new chip and soldering. This is so since otherwise the chip would be destroyed during the soldering process.

It should be noted that the present invention, the apparatus and method thereof, is not limited to hybrid circuits, but rather any packaging technique in which a circuit chip having bonding pads is soldered to corresponding bonding pads of a support structure with a soldering material having a melting temperature below that of the chip, the associated electrical components, and the electrical heating means. Furthermore, the invention of the present application is not limited in scope by way of the soldering process or soldering material selected for soldering a circuit chip to a substrate or support structure.

The embodiments of the invention in which an exclusive property or right is claimed are defined as follows:

1. A method for removing an electrical circuit chip wherein electrical circuit components are provided therewith, wherein said circuit chip includes bonding pads electrically connected to selected ones of said circuit components, wherein said pads are positioned on one side of said chip and adapted to be soldered with a solderable material to corresponding bonding pads of a support structure, the method comprising the steps of:

electrically connecting an electrical energization source to a resistive heating means integral with said circuit chip, and establishing a current flow through said resistive means capable of raising the temperature of said electrical circuit chip bonding pads, by heat conduction through said chip, sufficient to melt said solderable material;

separating said circuit chip from said support structure.

2. The method of claim 1 wherein said electrical heating means is an electrical resistance.

3. The method of claim 2 wherein said electrical resistance is a thin or thick film resistor integral with said chip.

4. The method of claim 2 wherein said chip is a silicon monolithic intergrated circuit chip and said electrical resistance is a portion of and integral with said integrated circuit chip.

5. A method for bonding an electrical circuit chip wherein electrical circuit components are provided therewith, wherein said circuit chip includes bonding pads electrically connected to selected ones of said circuit components, wherein said pads are positioned on one side of said chip and adapted to be soldered with a solderable material to corresponding bonding pads of a support structure, the method comprising the steps of:

positioning said circuit chip on said support structure so that said circuit chip bonding pads overlay corresponding bonding pads of said structure with said solderable material interposed therebetween;

electrically connecting an electrical energization source to an electrical heating means integral with said circuit chip and establishing a current flow through said resistive means capable of raising the temperature of said electrical circuit chip bonding pads by heat conduction through said chip, electrically disconnecting said electrical energization source thereby allowing said solderable material to solidify and bond said circuit chip to said support structure.

6. The method of claim 5 wherein said electrical heating means is a resistive material.

7. The method of claim 6 wherein said resistive material is integral with said chip by way of thin or thick film processes.

8. The method of claim 6 wherein said resistive material is diffused within portions of said electrical circuit chip.

* * * * *